United States Patent
Chang et al.

(10) Patent No.: US 8,618,446 B2
(45) Date of Patent: Dec. 31, 2013

(54) SUBSTRATE SUPPORT WITH SUBSTRATE HEATER AND SYMMETRIC RF RETURN

(75) Inventors: Yu Chang, San Jose, CA (US);
Gwo-Chuan Tzu, Sunnyvale, CA (US);
Anqing Cui, Palo Alto, CA (US);
William W. Kuang, Sunnyvale, CA (US); Olkan Cuvalci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 13/173,471

(22) Filed: Jun. 30, 2011

(65) Prior Publication Data

US 2013/0001215 A1 Jan. 3, 2013

(51) Int. Cl.
*A21B 1/00* (2006.01)
*C23C 16/00* (2006.01)

(52) U.S. Cl.
USPC ........... 219/391; 219/390; 219/405; 219/411; 392/416; 392/418; 118/724; 118/725; 118/50.1; 118/719; 118/726; 118/729; 118/723 E

(58) Field of Classification Search
USPC .............. 219/390–1, 405, 411; 392/416, 418; 118/724, 725, 50.1, 719, 726, 729, 118/723 E
See application file for complete search history.

(56) References Cited

U.S. PATENT DOCUMENTS

| | | | |
|---|---|---|---|
| 4,388,601 A | 6/1983 | Sneed, Jr. et al. |
| 6,112,697 A | 9/2000 | Sharan et al. |
| 6,221,221 B1 | 4/2001 | Al-Shaikh et al. |
| 2004/0083977 A1 | 5/2004 | Brown et al. |
| 2010/0013572 A1 | 1/2010 | Shannon et al. |

OTHER PUBLICATIONS

International Search Report and Written Opinion mailed Jan. 31, 2013 for PCT Application No. PCT/US2012/043967.

*Primary Examiner* — Shawntina Fuqua
(74) *Attorney, Agent, or Firm* — Moser Taboada; Alan Taboada

(57) ABSTRACT

Apparatus for processing a substrate are provided herein. In some embodiments, a substrate support includes a substrate support surface and a shaft; an RF electrode disposed in the substrate support proximate the substrate support surface to receive RF current from an RF source; a heater disposed proximate the substrate support surface to provide heat to a substrate when disposed on the substrate support surface, the heater having one or more conductive lines to provide power to the heater; a thermocouple to measure the temperature of a substrate when disposed on the substrate support surface; and a conductive element having an interior volume with the one or more conductive lines and the thermocouple disposed through the interior volume, the conductive element coupled to the RF electrode and having an electric field of about zero in the interior volume when RF current is flowed through the conductive element.

22 Claims, 4 Drawing Sheets

SUBSTRATE SUPPORT WITH SUBSTRATE HEATER AND SYMMETRIC RF RETURN

FIELD

Embodiments of the present invention generally relate to substrate processing systems, and more specifically to substrate supports for use in substrate processing systems.

BACKGROUND

Substrate processing apparatus typically include a substrate support to support a substrate during processing. The substrate support may include a radio frequency (RF) electrode disposed proximate a substrate processing surface to receive RF current from an RF source. For example, the RF electrode may act as an RF return to ground or have the RF source coupled to the RF electrode. The RF electrode may be coupled to a rod, a wire, or the like to provide RF current to the RF electrode or to return the RF current to ground. The substrate support may further include a heater disposed proximate the substrate processing surface to heat a substrate when disposed on the substrate processing surface. However, the inventors have observed certain disadvantages of conventional substrate supports in substrate processing systems.

Thus, the inventors have provided an improved substrate processing apparatus.

SUMMARY

Apparatus for processing a substrate are provided herein. In some embodiments, a substrate support includes a substrate support surface and a shaft to support the substrate support surface; an RF electrode disposed in the substrate support proximate the substrate support surface to receive RF current from an RF source; a heater disposed in the substrate support proximate the substrate support surface to provide heat to a substrate when disposed on the substrate support surface, the heater having one or more conductive lines to provide power to the heater; a thermocouple disposed in the substrate support to measure the temperature of a substrate when disposed on the substrate support surface; and a conductive element having an interior volume with the one or more conductive lines and the thermocouple disposed through the interior volume, the conductive element coupled to the RF electrode and having an electric field of about zero in the interior volume when RF current is flowed through the conductive element. In some embodiments, the conductive element returns the RF current to ground.

In some embodiments, an apparatus for processing a substrate includes a process chamber having a processing volume; a substrate support having a substrate support surface and a shaft to support the substrate support surface; a first RF electrode disposed in the substrate support proximate the substrate support surface to receive RF current from an RF source; a heater disposed in the substrate support proximate the substrate support surface to provide heat to a substrate when disposed on the substrate support surface, the heater having one or more conductive lines to provide power to the heater; a thermocouple disposed in the substrate support to measure the temperature of a substrate when disposed on the substrate support surface; and a conductive element having an interior volume with the one or more conductive lines and the thermocouple disposed through the interior volume, the conductive element coupled to the RF electrode and having an electric field of about zero in the interior volume when RF current is flowed through the conductive element. In some embodiments, the apparatus further includes a second RF electrode disposed above the substrate support, wherein the second RF electrode is disposed in the processing volume of the process chamber and wherein the RF source is coupled to the second RF electrode to provide the RF current to the second RF electrode. In some embodiments, the conductive element includes a first end coupled to the first RF electrode and a second end coupled to ground.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
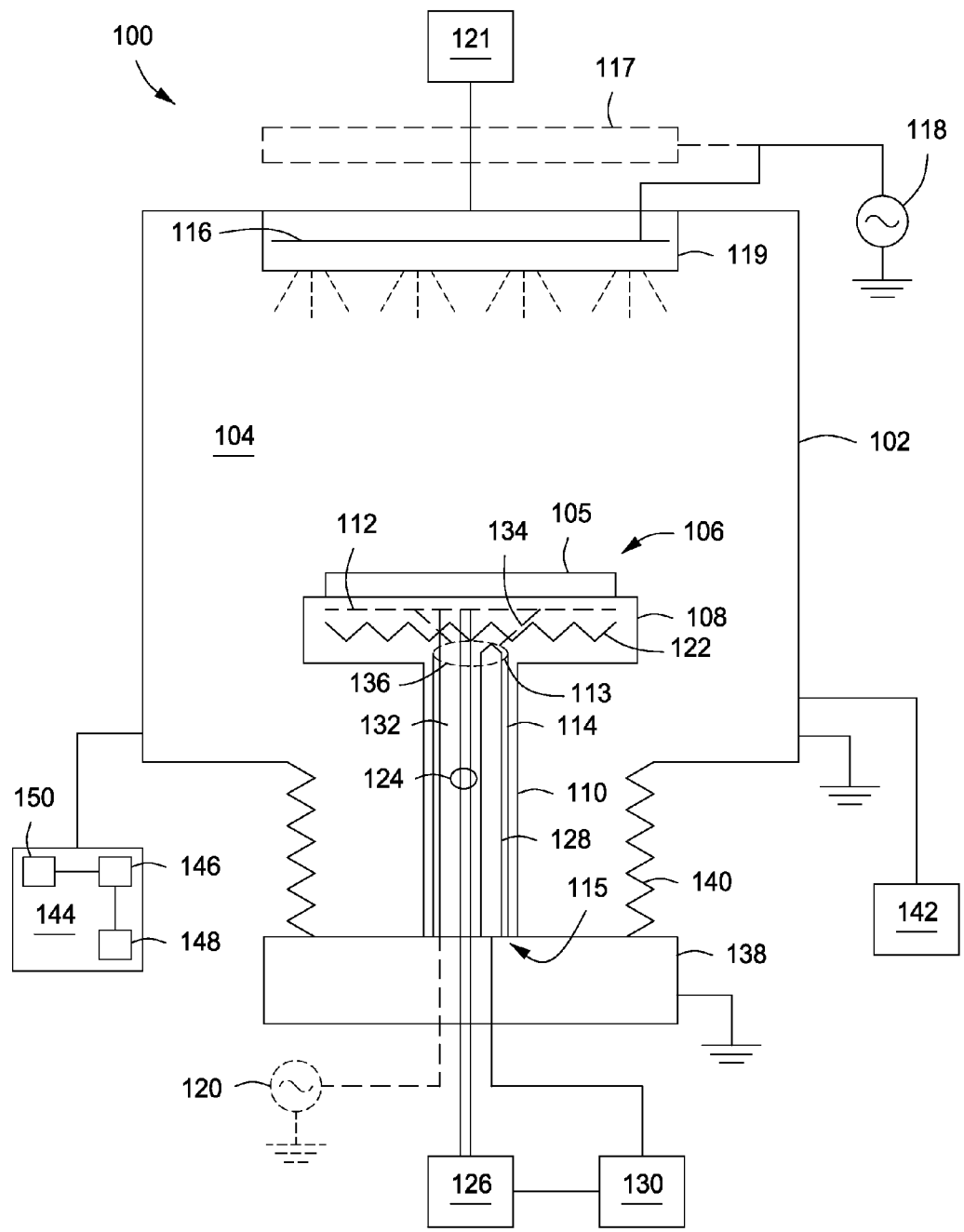
FIG. 1 depicts a schematic view of a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for processing a substrate is disclosed herein. Embodiments of the inventive apparatus may advantageously permit RF power to be received by an RF electrode disposed in a substrate support without distorting the accuracy of temperature measurements made by a thermocouple or other temperature monitoring device present in the substrate support.

FIG. 1 depicts a schematic view of a substrate processing system in accordance with some embodiments of the present invention. For example, an apparatus 100 for processing a substrate may include a process chamber 102 having a processing volume 104 and a substrate support 106 disposed in the processing volume 104 for supporting a substrate 105. The process chamber 102 may comprise walls formed of conductive materials, such as aluminum (Al) or the like. In some embodiments, for example, when the process chamber 102 is configured for capacitively or inductively coupled plasma applications, the process chamber may have a ceiling comprising a dielectric material (not shown). Exemplary process chambers may include any suitable plasma process chamber, such those used for generating one or more of a remote, inductively coupled, or capacitively coupled plasma. Suitable process chambers may include the DPS®, ENABLER®, ADVANTEDGE™, or other process chambers, available from Applied Materials, Inc. of Santa Clara, Calif. Other suitable process chambers may similarly be used.

The substrate support 106 may include a substrate support surface 108 and a shaft 110 to support the substrate support surface 108. Although illustrated in FIG. 1 as a pedestal-type design, the substrate support may be any suitable substrate support having a substrate support surface and a member, such as the shaft 110 or any other suitable member for supporting the substrate support surface. In some embodiments, the substrate support 106 may comprise a ceramic material, such as aluminum oxide ($Al_2O_3$) or aluminum nitride (AlN).

The substrate support 106 may include an RF electrode 112 (e.g., a first RF electrode) disposed in the substrate support 106 proximate the substrate support surface to receive RF current from an RF source. In some embodiments, the RF electrode 112 may provide an RF return path and may be coupled through a conductive element 114 to ground as illustrated in the primary view in FIG. 1. For example, the RF electrode 112 may function as an RF return path, for example, when the process chamber 102 is configured as a capacitively coupled plasma apparatus. In a capacitively coupled plasma apparatus, a second RF electrode 116 may be disposed above the substrate support 106 as illustrated in the primary view in FIG. 1. The second RF electrode 116 may be disposed in the processing volume 104 and an RF source 118 may be coupled to the second electrode 116 as illustrated in the primary view in FIG. 1. For example, the second electrode 116 may be a showerhead (not shown), or part of and/or disposed in a showerhead 119 as illustrated in FIG. 1, or any suitable embodiment of an overhead electrode used in a capacitively coupled plasma apparatus.

In some embodiments, the process chamber 102 may be configured as an inductively coupled plasma apparatus. In such embodiments, the second RF electrode (i.e., a second RF electrode 117 as illustrated in phantom in FIG. 1) may be disposed external to the processing volume 104 of the process chamber 102 and coupled to the RF source 118.

The showerhead 119 may be coupled to a gas panel 121 as illustrated in FIG. 1 to provide one or more process gases to the processing volume 104 to ignite a plasma in the processing volume 104 or the like. The showerhead 119 is merely one exemplary chamber component for delivering one or more process gases to the processing volume 104. Alternatively or in combination, the one or more process gases may be delivered to the processing volume 104 via side injection ports (not shown) disposed about the walls of the process chamber 102, or gas inlets disposed is other regions of the process chamber. Alternatively or in combination, the one or more process gases may be delivered to a remote volume (not shown) where a plasma is formed and then flowed into the processing volume 104.

In some embodiments, the RF electrode 112 may also be coupled to an output of an RF source (such as the RF source 120 shown in phantom in FIG. 1) couple to the RF electrode 112 via a conductive element and having an RF return path via the conductive element 114. For example, the RF electrode 112 may be used as an RF bias electrode or the like.

Returning to the substrate support 106, the substrate support 106 may include a heater 122 disposed in the substrate support 106 proximate the substrate support surface 108 to provide heat to the substrate 105 when disposed on the substrate support surface 108. The heater 122 may be any suitable heater used in a substrate support, such as a resistive heater or the like. The heater 122 may include one or more conductive lines 124 that extend from the heater 122 through the shaft 110 to provide power to the heater 122. For example, as illustrated in FIG. 1, the one or more conductive lines 124 may couple the heater 122 to a power supply 126 disposed external of the process chamber 102. For example, the one or more conductive lines 124 may include a first line for providing power from the power supply 126 to the heater 122 and a second line for returning power to the power supply 126. The power supply 126 may include an alternating current (AC) power source, a direct current (DC) power source or the like. Alternatively (not shown), the one or more conductive lines 124 may be a single conductive line, which provides power from the power supply 126 to the heater 122. In this alternative embodiment, the power may be returned to the power supply 126 or to ground via the conductive member 114. For example, the conductive member 114 may act as an electrical return for both the heater 122 and the RF electrode 112. Similarly (not shown), the layer 200 and the cylindrical body 300 (both discussed below) can also be used as a return for both the heater 122 and the RF electrode 112.

The substrate support 106 may include a thermocouple 128 disposed in the substrate support 106 to measure a desired temperature, such as the temperature of the substrate support 106, the support surface 108, or the temperature of the substrate 105 when disposed on the substrate support surface 108. For example, the thermocouple 128 may be any suitable thermocouple design, such as a thermocouple probe or the like. The thermocouple 128 may be removable. As illustrated in FIG. 1, the thermocouple 128 may extend along the shaft 110 of the substrate support 106 to proximate the substrate support surface 108. The thermocouple 128 as illustrated in FIG. 1 is merely exemplary, and the tip of the thermocouple may extend to proximate the heater 122 (as illustrated in FIG. 1) or to above the heater 122 and proximate the substrate support surface 108 (not shown). The location of the tip of the thermocouple 128 may be adjusted relative to the substrate support surface 108 to provide the most accurate measurement of temperature of the substrate 105 or of some other component such as the support surface 108. The thermocouple 128 may be coupled to a temperature controller 130. For example, the temperature controller 130 may control the power supply 126 based on the temperature measured by the thermocouple 128. Alternatively, the temperature controller 130 may be part of, or coupled to, a system controller, such as the system controller 144 that may control the operations of the substrate processing system 100.

In some embodiments, the conductive element 114 may be disposed along the shaft 110 of the substrate support 106. For example, the conductive element may include an interior volume 132 with the one or more conductive lines 124 and the thermocouple 128 disposed through the interior volume 132 of the conductive element 114. The conductive element 114 may be coupled to the RF electrode 112 as discussed above. For example, the conductive element 114 may have a first end 113 coupled to the RF electrode 112 via a plurality of contacts 134. The conductive element 114 may have a second end 115 coupled to ground via the chamber 102 or a chamber component, such as a lift mechanism 138 as illustrated in FIG. 1. The plurality of contacts 134 may be arranged in any suitable arrangement to form a conductive path between the RF electrode 112 and the conductive element 114. In some embodiments, the plurality of contacts 134 are symmetrically arranged with respect to the RF electrode 112 and the conductive element 114, for example in an azimuthally symmetric arrangement. In some embodiments, the plurality of contacts 134 are one or more contacts 134.

In some embodiments, the conductive element 114 may advantageously provide an electric field of about zero in the interior volume 132 when RF current flows through the conductive element 114. Providing an electric field in the interior volume 132 of about zero advantageously prevents or limits any interference arising from RF current flowing through the conductive element 114 that may affect other electric components disposed in the shaft, such as the thermocouple 128. The inventors have found, for example, that the rod-like conductive element used as an RF return path in conventional substrate supports provide a non-zero electric field in the shaft that interferes with the thermocouple 128 and causes the thermocouple to produce inaccurate temperature measurements. The conductive element 114 may comprise aluminum (Al), nickel (Ni) or the like.

In some embodiments, the conductive element 114 may be disposed in the shaft 110 of the substrate support 106. For example, as illustrated in FIG. 1, the conductive element may be a cylindrical body (as represented by dashed line 136), such as a cylinder or another suitable tubular structure having the interior volume 132 that produces an electric field of about zero in the interior volume when current flows along the surface of the body.

Figure 2:
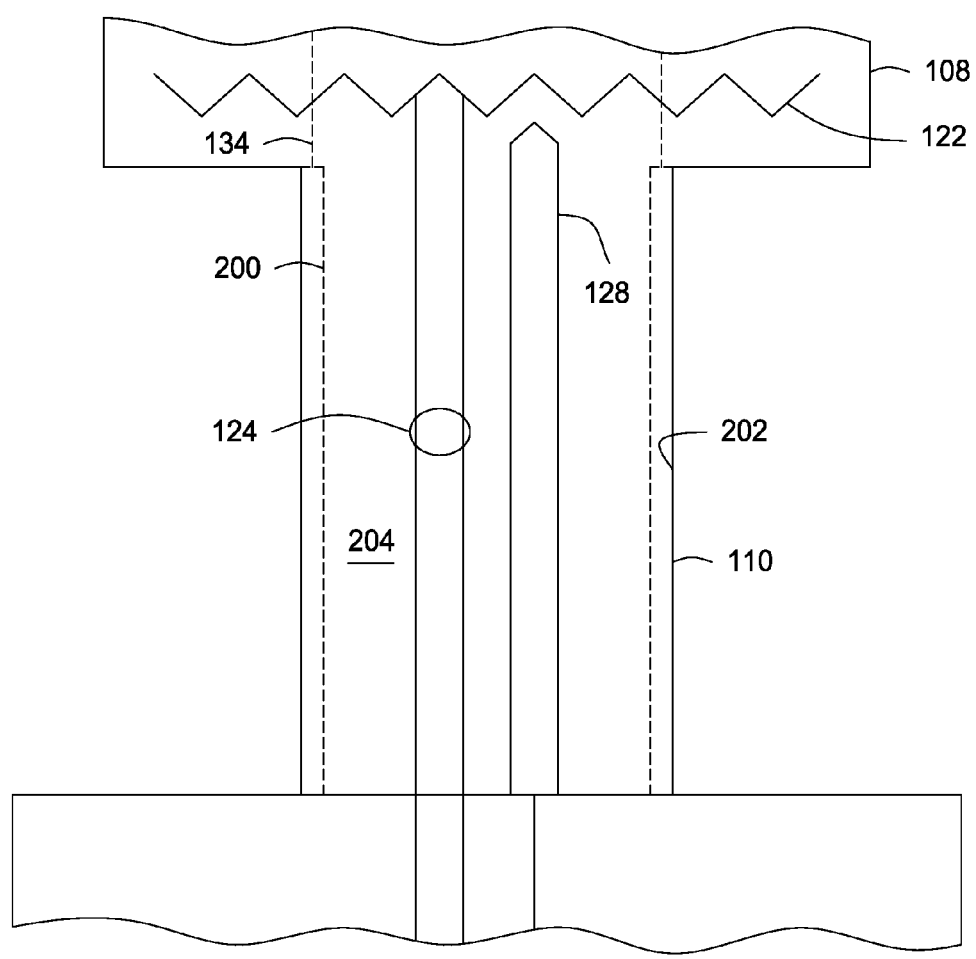
FIG. 2 depicts a partial schematic view of a substrate support in accordance with some embodiments of the present invention.

Alternatively, as illustrated in FIG. 2, the conductive element 114 may be a layer 200 disposed along an interior surface 202 of the shaft 110 of the substrate support 106. For example, the layer 200 may be applied to the interior surface 202 of the shaft 110 during fabrication, such as by spray coating or the like. Similar to the cylindrical body discussed above, an interior volume 204 formed by the layer 202 may produce an electric field of about zero in the interior volume 204 when RF current flows along the surface of the layer 200.

Figure 3:
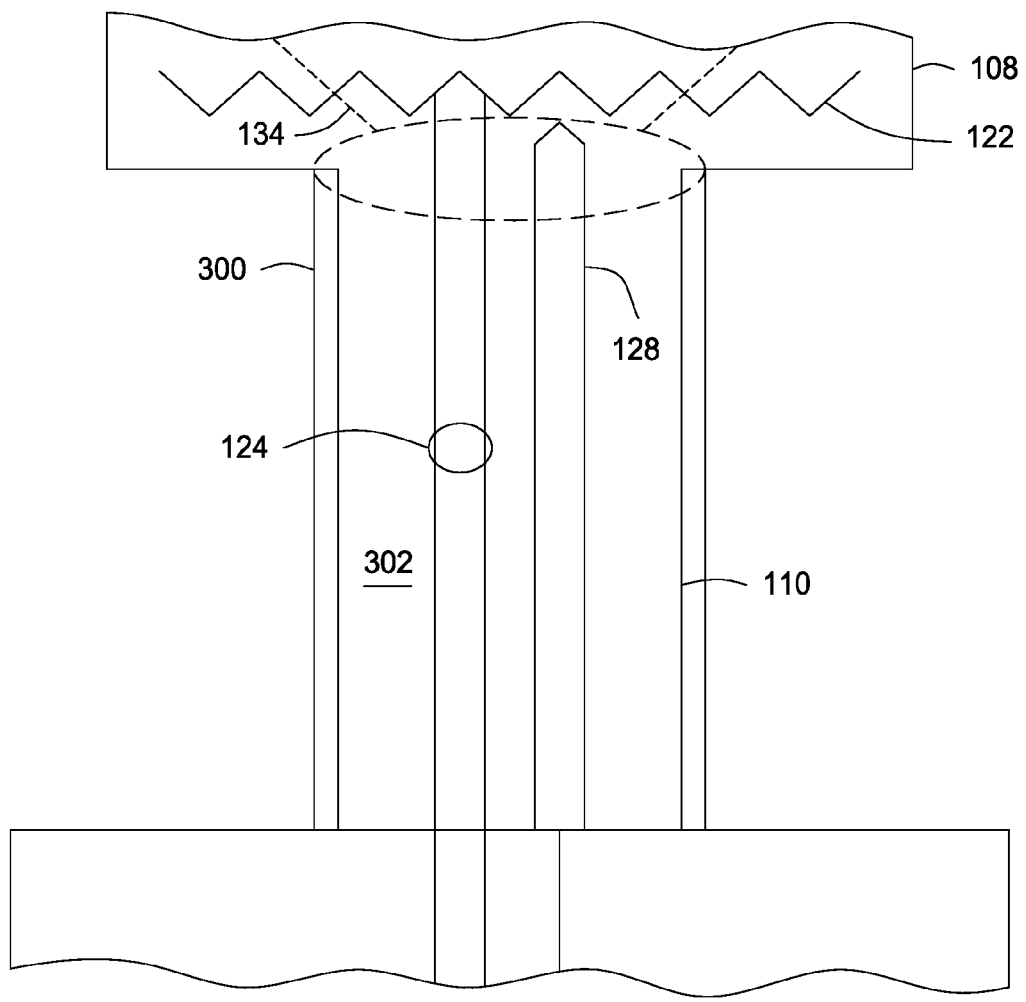
FIG. 3 depicts a partial schematic view of a substrate support in accordance with some embodiments of the present invention.
Figure 4:
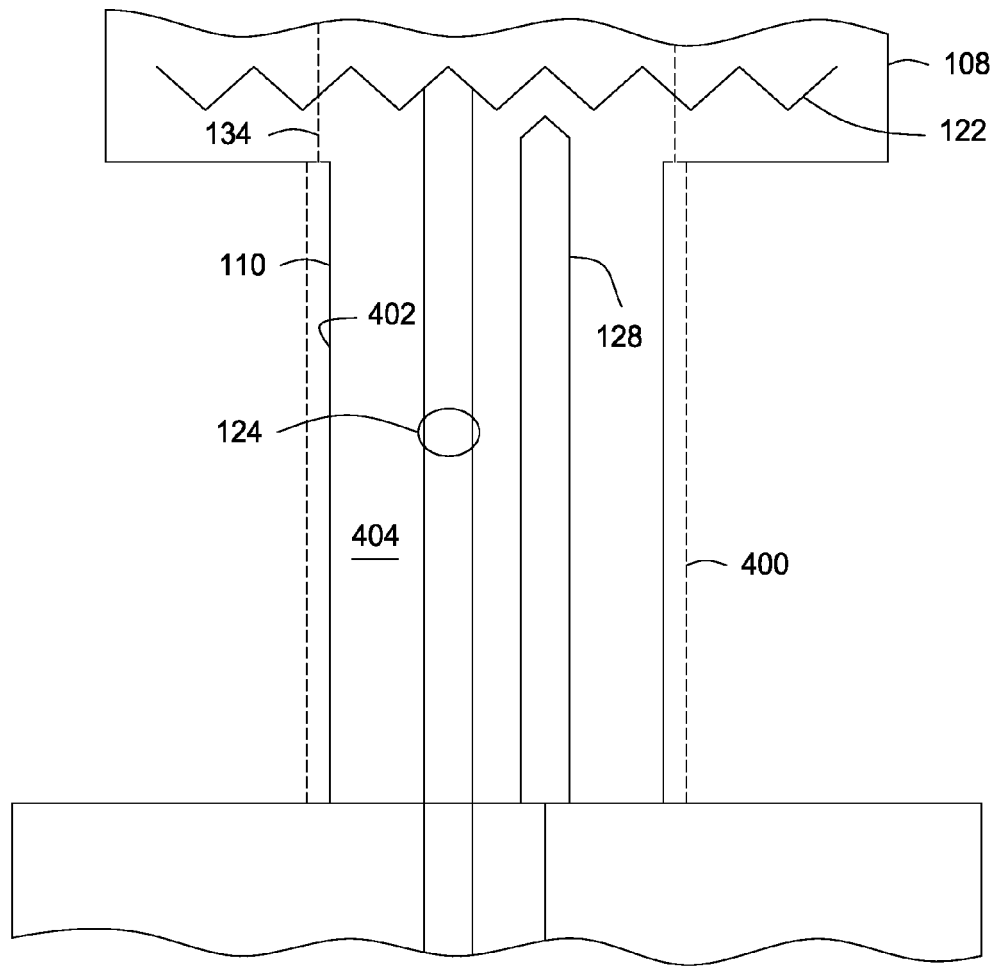
FIG. 4 depicts a partial schematic view of a substrate support in accordance with some embodiments of the present invention.

Alternatively, the conductive element 114 may be disposed external to and about the shaft 110 of the substrate support 106. For example, as illustrated in FIG. 3, the conductive element may be a cylindrical body 300, such as a cylinder or another suitable tubular structure having an interior volume 302 that produces an electric field of about zero in the interior volume 302 when RF current flows along the surface of the body.

Alternatively, the conductive element 114 may be a layer 400 disposed along an exterior surface 402 of the shaft 110 of the substrate support 106. For example, the layer 400 may be applied to the exterior surface 402 of the shaft 110 during fabrication, such as be spray coating or the like. Similar to the cylindrical body 300 discussed above, an interior volume 404 formed by the layer 400 may produce an electric field of about zero in the interior volume 404 when RF current flows along the surface of the layer 400.

Returning to FIG. 1, the substrate 105 may enter the process chamber 102 via an opening (not shown) in a wall of the process chamber 102. The opening may be selectively sealed via a slit valve, or other mechanism for selectively providing access to the interior of the chamber through the opening. The substrate support 106 may be coupled to a lift mechanism 138 that may control the position of the substrate support 106 between a lower position (as shown) suitable for transferring substrates into and out of the chamber via the opening and a selectable upper position suitable for processing. The process position may be selected to maximize process uniformity for a particular process. When in at least one of the elevated processing positions, the substrate support 106 may be disposed above the opening to provide a symmetrical processing region. The lift mechanism 138 may be coupled to the process chamber 102 via a bellows 140 or other flexible vacuum hose to maintain a desired pressure in the processing volume 104 when the substrate support 106 is moved. The lift mechanism 138 may be grounded as illustrated in FIG. 1. For example, the conductive element 114 may be grounded via the lift mechanism 138. Alternatively, the lift mechanism 138 may be ground via the process chamber 102 through the bellows 140.

The apparatus may include additional components that are common to process chambers, such as an exhaust system 142 for removing excess process gases, processing by-products, or the like, from the processing volume 104 of the process chamber 102. For example, the exhaust system 142 may include a vacuum pump coupled to a pumping plenum via a pumping port for pumping out the exhaust gases from the process chamber 102 (not shown), or any suitable exhaust system. For example, the vacuum pump may be fluidly coupled to an exhaust outlet for routing the exhaust as required to appropriate exhaust handling equipment. A valve (such as a gate valve, z-motion valve, or the like) may be disposed in the pumping plenum to facilitate control of the flow rate of the exhaust gases in combination with the operation of the vacuum pump.

To facilitate control of the process chamber 102 as described above, a controller 144 comprises a central processing unit (CPU) 146, a memory 148, and support circuits 150 for the CPU 146 and facilitates control of the components of the chamber 102. The controller 144 may be one of any form of general-purpose computer processor that can be used in an industrial setting for controlling various chambers and sub-processors. The memory 148, or computer-readable medium, of the CPU 146 may be one or more of readily available memory such as random access memory (RAM), read only memory (ROM), floppy disk, hard disk, or any other form of digital storage, local or remote. The support circuits 150 are coupled to the CPU 146 for supporting the processor in a conventional manner. These circuits include cache, power supplies, clock circuits, input/output circuitry and sub-systems, and the like. The methods performed in the process chamber 102, or at least portions thereof, may be stored in the memory 148 as a software routine. The software routine may also be stored and/or executed by a second CPU (not shown) that is remotely located from the hardware being controlled by the CPU 146.

Thus, apparatus for processing a substrate is disclosed herein. Embodiments of the inventive apparatus may advantageously permit RF power to be received by an RF electrode disposed in a substrate support without interfering with other electrical components routed through the substrate support, such as interfering with the accuracy of temperature measurements made by a thermocouple or other temperature monitoring device present in the substrate support.

While the foregoing is directed to embodiments of the present invention, other and further embodiments of the invention may be devised without departing from the basic scope thereof.

The invention claimed is:

1. A substrate support, comprising:
   a substrate support surface and a shaft to support the substrate support surface;
   an RF electrode disposed in the substrate support proximate the substrate support surface to receive RF current from an RF source;
   a heater disposed in the substrate support proximate the substrate support surface to provide heat to a substrate when disposed on the substrate support surface, the heater having one or more conductive lines to provide power to the heater; and
   a conductive element having an interior volume with the one or more conductive lines disposed through the interior volume, the conductive element coupled to the RF electrode and having an electric field of about zero in the interior volume when RF current is flowed through the conductive element.

2. The substrate support of claim 1, wherein the conductive element returns the RF current to ground.

3. The substrate support of claim 1, further comprising:
an RF source coupled to the RF electrode via the conductive element to provide the RF current to the RF electrode.

4. The substrate support of claim 1, wherein the conductive element is disposed in the shaft of the substrate support.

5. The substrate support of claim 4, wherein the conductive element is a cylindrical body.

6. The substrate support of claim 4, wherein the conductive element is a layer disposed along an interior surface of the shaft of the substrate support.

7. The substrate support of claim 1, wherein the conductive element is disposed about the shaft of the substrate support.

8. The substrate support of claim 7, wherein the conductive element is a cylindrical body.

9. The substrate support of claim 7, wherein the conductive element is a layer disposed along an exterior surface of the shaft of the substrate support.

10. An apparatus for processing a substrate, comprising:
a process chamber having a processing volume;
a substrate support having a substrate support surface and a shaft to support the substrate support surface;
a first RF electrode disposed in the substrate support proximate the substrate support surface to receive RF current from an RF source;
a heater disposed in the substrate support proximate the substrate support surface to provide heat to a substrate when disposed on the substrate support surface, the heater having one or more conductive lines to provide power to the heater; and
a conductive element having an interior volume with the one or more conductive lines disposed through the interior volume, the conductive element coupled to the RF electrode and having an electric field of about zero in the interior volume when RF current is flowed through the conductive element.

11. The apparatus of claim 10, further comprising:
a second RF electrode disposed above the substrate support.

12. The apparatus of claim 11, wherein the second RF electrode is disposed in the processing volume of the process chamber and wherein the RF source is coupled to the second RF electrode to provide the RF current to the second RF electrode.

13. The apparatus of claim 12, wherein the conductive element comprises a first end coupled to the first RF electrode and a second end coupled to ground.

14. The apparatus of claim 11, wherein the second RF electrode is disposed external to the processing volume of the process chamber and wherein the RF source is coupled to the first RF electrode to provide the RF current to the first RF electrode.

15. The apparatus of claim 10, wherein the conductive element is disposed in the shaft of the substrate support.

16. The apparatus of claim 15, wherein the conductive element is a cylindrical body.

17. The apparatus of claim 15, wherein the conductive element is a layer disposed along an interior surface of the shaft of the substrate support.

18. The apparatus of claim 10, wherein the conductive element is disposed about the shaft of the substrate support.

19. The apparatus of claim 18, wherein the conductive element is a cylindrical body.

20. The apparatus of claim 18, wherein the conductive element is a layer disposed along an exterior surface of the shaft of the substrate support.

21. The apparatus of claim 1, further comprising:
a thermocouple disposed in the substrate support to measure the temperature of a substrate when disposed on the substrate support surface, wherein the thermocouple is disposed through the interior volume of the conductive element.

22. The apparatus of claim 1, further comprising:
a thermocouple disposed in the substrate support to measure the temperature of a substrate when disposed on the substrate support surface, wherein the thermocouple is disposed through the interior volume of the conductive element.

* * * * *

UNITED STATES PATENT AND TRADEMARK OFFICE
CERTIFICATE OF CORRECTION

| | |
|---|---|
| PATENT NO. | : 8,618,446 B2 |
| APPLICATION NO. | : 13/173471 |
| DATED | : December 31, 2013 |
| INVENTOR(S) | : Yu Chang et al. |

It is certified that error appears in the above-identified patent and that said Letters Patent is hereby corrected as shown below:

In the Claims:

In column 8, line 29, Claim 21, delete the phrase "The apparatus of claim 1," and substitute therefor -- The substrate support of claim 1 --.

In column 8, line 35, Claim 22, delete the phrase "The apparatus of claim 1," and substitute therefor -- The apparatus of claim 10 --.

Signed and Sealed this
Twelfth Day of August, 2014

Michelle K. Lee
*Deputy Director of the United States Patent and Trademark Office*